United States Patent [19]

Jeong

[11] Patent Number: 5,708,620
[45] Date of Patent: Jan. 13, 1998

[54] MEMORY DEVICE HAVING A PLURALITY OF BITLINES BETWEEN ADJACENT COLUMNS OF SUB-WORDLINE DRIVERS

[75] Inventor: Jae-Hong Jeong, Seoul, Rep. of Korea

[73] Assignee: LG Semicon Co., Ltd, Cheongju, Rep. of Korea

[21] Appl. No.: 649,564

[22] Filed: May 17, 1996

[30] Foreign Application Priority Data

Apr. 4, 1996 [KR] Rep. of Korea ............... 10181/1996

[51] Int. Cl.$^6$ ............................................. G11C 8/00
[52] U.S. Cl. ............... 365/230.06; 365/64; 365/189.08; 365/230.03
[58] Field of Search ............... 365/230.03, 230.06, 365/63, 189.08, 51

[56] References Cited

U.S. PATENT DOCUMENTS

| | | | |
|---|---|---|---|
| 5,107,459 | 4/1992 | Chu et al. | 365/63 |
| 5,172,335 | 12/1992 | Sasaki et al. | 365/63 |
| 5,416,748 | 5/1995 | Fujita | 365/230.06 |
| 5,506,816 | 4/1996 | Hirose et al. | 365/230.06 |

*Primary Examiner*—David C. Nelms
*Assistant Examiner*—Hien Nguyen
*Attorney, Agent, or Firm*—Fleshner & Kim

[57] ABSTRACT

A memory device of the present invention includes a plurality of bitlines and main wordlines formed in first and second directions, respectively, to form a matrix, and a plurality of memory cells coupled to each bitline. A first decoder decodes first address signals and provides first decoded signals to the plurality of main wordlines. A second decoder decodes second address signals and provides second decoded signals. The memory device also includes n-th number of groups of drivers, and each group has a plurality of sub-drivers formed in a third direction to receive a corresponding second decoded signal. Each sub-driver has a plurality of selection lines coupled to corresponding memory cells, and a plurality of sense amplifiers is coupled to said plurality of bitlines, wherein more than two bitlines are formed between adjacent groups of drivers.

21 Claims, 9 Drawing Sheets

MEMORY DEVICE HAVING A PLURALITY OF BITLINES BETWEEN ADJACENT COLUMNS OF SUB-WORDLINE DRIVERS

FIELD OF THE INVENTION

The present invention relates to a semiconductor memory device, and particularly to an improved hierarchical word line structure for a semiconductor memory device by which the chip size of the semiconductor memory device can be minimized, a desired fabrication margin can be obtained, and a data access time can be made faster by using a sub-word line driver and a word strap in a word line structure in a semiconductor device of a dual word line structure including a main-word line and a sub-word line.

DESCRIPTION OF THE CONVENTIONAL ART

Conventionally, a semiconductor memory device includes a plurality of word lines WL formed of a material such as a polysilicon or a polysilicide having a relatively high electrical resistance. Since most of the word lines have a narrow width, a long length and a relatively high resistance, when a cell driving voltage is supplied from a row decoder to access a remote memory cell when reading/writing data, an RC delay occurs in proportion to the product of the capacitance C of the word line times its resistance R, so that the access speed characteristic becomes deteriorated.

Therefore, a main word line (MWL) having a low electrical resistance is parallely arranged with a sub-word line (SWL) forming the gate of a cell transistor and connected to the main word line by electrical contacts at a predetermined interval therealong, so that the access speed characteristic of the memory device can be improved. The above-described technique is called a word shunt or a word strap. For implementing such a technique, the number of the main-word lines and the number of the sub-word lines should be equal.

FIG. 1 shows a wiring arrangement of a word line of a conventional semiconductor memory device which is constructed implementing a word strap technique. As shown therein, there are arranged main-word lines $MWL_1$ through $MWL_n$ connected to a row decoder 10 and arranged in a plurality of rows, and a plurality of sub-word lines SWL parallely arranged under each main-word line MWL, spaced-part at a predetermined interval and electrically connected to the main-word line MWL.

The operation of the conventional memory device having the above-described construction will now be described.

To begin with, when one of the row decoders 10 is enabled in accordance with an applied row address information signal A1, a corresponding main-word line MWL is rendered active-high level, and each of the sub-main word lines SWL electrically connected with the thusly activated main-word line MWL is consequently rendered active high level (high state), and the data of the memory cell (not shown) connected to the corresponding sub-word line SWL is read, or an externally input data is written into the cell.

However, in the conventional memory device constructed implementing such as a word strap technique, the number of the main-word lines MWL used for improving the RC delay characteristic of the word lines should be the same as the number of the word lines. As the density of cells is increased, the pitch of the word lines is reduced, and the distance between the main word lines MWL is reduced. Therefore, in a process of fabricating a DRAM memory device such as a 256-Mb or larger memory device, since the distance between main-word lines is 0.6 μm or less, the difficulties in fabricating electrical contacts for the main word lines (for example, implementing a word strap process) are increased, and thus the yield is sharply reduced.

In order to resolve the above-mentioned problems, a memory device having a dual word line structure was developed for use in fabricating DRAM device of more than 256-Mb, as described in U.S. Pat. No. 5,416,748 entitled "Semiconductor memory device having dual word line structure", the disclosure of which prior patent publication is incorporated herein by reference thereto.

FIG. 2 shows a wiring arrangement of the word lines in a conventional semiconductor memory device adopting such a hierarchical dual word line structure. As shown in FIG. 2, the memory device includes a plurality of main-word lines $MWL_1$ through $MWL_n$ formed of a metallic material, and a plurality of sub-word lines SWL formed of a material such as a polysilicon or a polysilicide, the gate of a cell transistor (not shown) connected to each sub-word line SWL being formed thereby. The main-word lines $MWL_1$ through $MWL_n$ are parallely connected to the row decoders 10 which are arranged in the same column, and to sub-word line drivers (SWD) 20 which are arranged in N-rows and M-columns between each two neighboring main-word lines, and each sub-word line driver 20 is connected to a corresponding main-word line MWL. In addition, a sub-word line SWL is connected to an output node of each corresponding sub-word line driver 20, and power nodes of the sub-word line drivers 20 arranged in the same column are alternatingly connected at intervals to a corresponding one of a pair of coding lines CL which are connected to a word driver decoder (not shown).

The conventional hierarchical dual word line structure having a main-word line MWL and a sub-word line SWL as shown in FIG. 2 is directed to using a sub-word line driver 20 instead of a word strap technique, as shown in FIG. 1, for driving the sub-word line. The operation thereof will now be explained.

To begin with, when one of the row decoders 10 is enabled in accordance with a row address information signal A1 which is externally applied thereto, the main-word line MWL connected to the thusly enabled row decoder 10 is in turn enabled. Thereafter, one of the coding lines CL of a selected column is enabled in accordance with address information signals (not shown) applied to a block decoder (not shown) and sub-word drive decoder (not shown). Therefore, a corresponding sub-word line driver 20 is enabled in accordance with the signal applied to it input node through the main word line MWL enabled by the row decoder 10 and the signal applied to its power node by associated coding line CL, and the sub-word line SWL connected to the output node of the thusly enabled sub-word line driver 20 is made active, whereby the data of the memory cell associated with the activated sub-word line SWL is read, or an externally input data is written into the memory cell.

The conventional semiconductor memory device adapting the above-described hierarchical dual word line structure has advantages in that the fabrication process therefor is simple and the yield of the semiconductor memory devices can be increased by maintaining sufficient spacing between the metallic lines which are used as the main-word lines.

However, because the lay-out area of each sub-word line driver is large, the size of the memory chip becomes large. In order to fabricate such a memory device without increasing the size of the chip, since it is necessary to reduce the size of other areas of the memory chip, the yield of the semiconductor devices is reduced.

SUMMARY OF THE INVENTION

Accordingly, it is an object of the present invention to provide a semiconductor memory device which overcomes the problems encountered in the conventional semiconductor memory device.

It is another object of the present invention to provide an improved hierarchical word line structure for a semiconductor memory device by which a chip size of the semiconductor device is minimized, a desired fabrication margin can be obtained, and a data access time becomes faster by using a sub-word line driver and a word strap in a word line structure of a semiconductor device having a dual or hierarchical word line structure including a main-word line and a sub-word line.

To achieve the above objects, there is provided a hierarchical word line structure for a semiconductor memory device having a plurality of memory array blocks each including a plurality of rows and columns of memory cells, each memory array block having a row decoder, a plurality of main word lines connected to the row decoder and each arranged in one of the plurality of rows, a plurality of sub-word line drivers each having an input node, a power node and an output node and being arranged in a plurality of columns and sub-rows in each of the plurality of rows between two neighboring ones of the main word lines, the input nodes of the sub-word drivers in each row being connnected with an associated one of the plurality of main word lines, and coding lines being connected to the power nodes of the sub-word line drivers arranged in the same column, the hierarchical word line structure, comprising:

the sub-word drivers in each two neighboring columns being arranged to have their respective output nodes opposed towards one another, a sub-word line being connected to the output node of each of the plurality of sub-word line drivers, the sub-word line extending from the output node toward the neighboring column; and a word strap line extending in parallel relation with each sub-word line, one end of which word strap line is commonly connected to the output node of the corresponding sub-word line driver and to the associated sub-word line, and another end of which word strap line is connected by a contact metallization to an intermediate portion of the sub-word line.

The sub-word line may be connected to the sub-word driver only via the word strap line, or the sub-word line may be segmented into a first segment which is connected to the output node of the sub-word driver and a second segment connected to the other end of the word strap line. Or, the sub-word line may be unsegmented and be commonly connected at one end to the output node of the sub-word driver and at an intermediate point to the other end of the word strap line.

BRIEF DESCRIPTION OF THE DRAWINGS

FIGS. 4A and 4B are circuit diagrams of a sub-word line driver of FIG. 3, of which FIG. 4A shows an NMOS sub-word line driver and FIG. 4B shows a CMOS sub-word line driver according to the present invention;

DETAILED DESCRIPTION OF THE INVENTION

Figure 3:
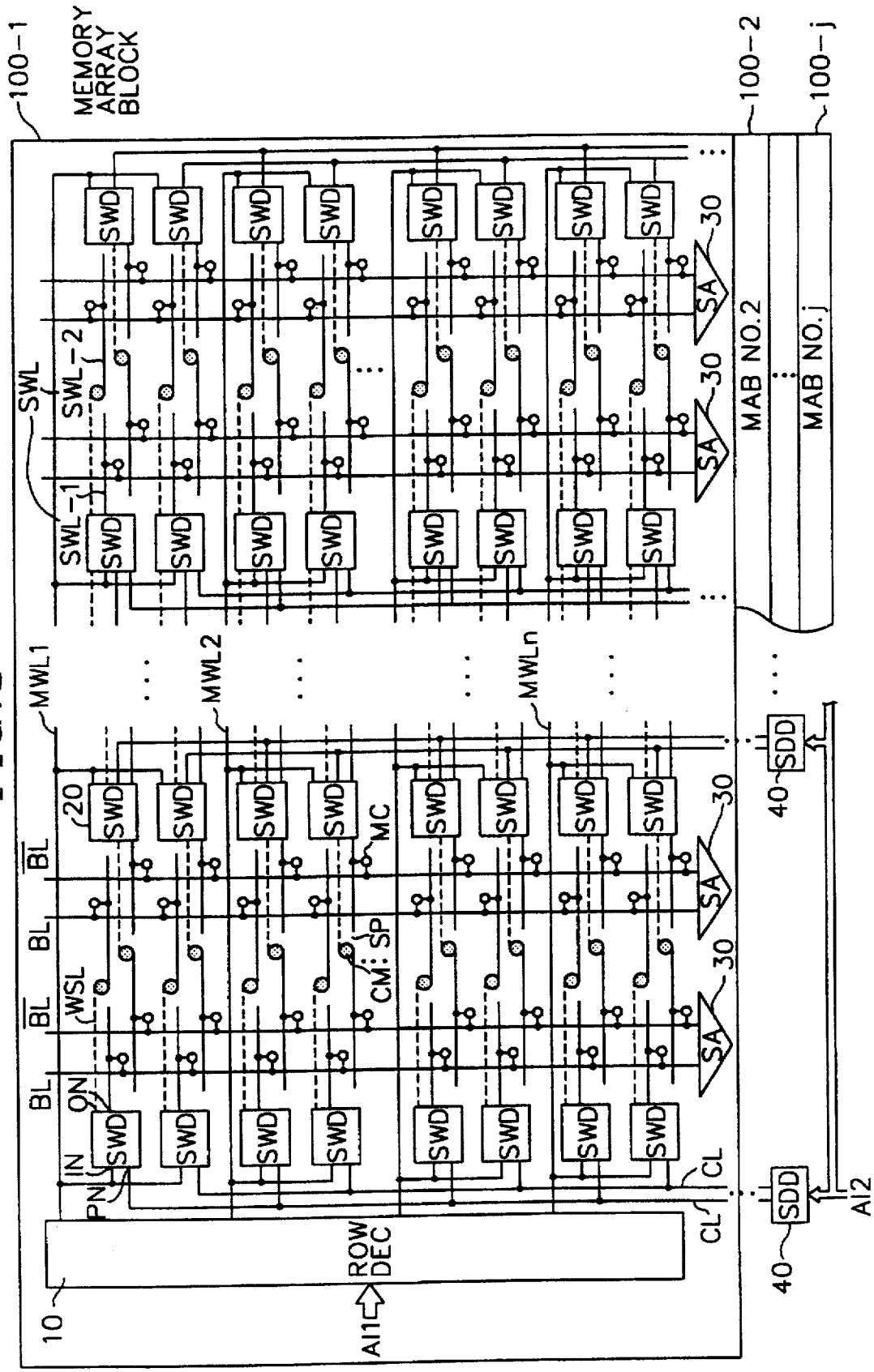
FIG. 3 is a block diagram showing a word line structure of a semiconductor memory device according to a first embodiment of the present invention.

FIG. 3 shows a construction of hierarchical word lines in a DRAM semiconductor memory device in accordance with a first embodiment of the present invention.

As shown in FIG. 3, a DRAM semiconductor memory device implementing a word line structure in accordance with the present invention includes a plurality of memory array blocks 100-1 through 100-j. Because the memory array blocks 100-1 through 100-j are identical with one another, only the memory array block 100-1 as shown in FIG. 3 will be described.

The memory array block 100-1 includes a row decoder 10, to which a plurality of main-word lines $MWL_1$ through $MWL_n$ are connected and arranged to extend in the row direction. A plurality of sub-word drivers (SWD) 20 are arranged in a plurality of columns and sub-rows between each two neighboring main word lines, and each of the sub-word drivers 20 of a particular row has an input node IN connected to the associated main word line MWL.

Also, each sub-word driver has an output node ON, to which are connected a word strap line WSL and a first sub-word line segment SWL-1 extending parallel with one another in the row direction. Each word strap line WSL is formed of a metallic material having a low electrical resistance and extends in the row direction from its associated sub-word driver 20 by a distance which is longer than the length of the corresponding first sub-word line segment SWL-1.

A second sub-word line segment SWL-2 aligned with and spaced slightly from the first sub-word line segment SWL-1 extends in the row direction from a segmentation point SP therebetween. The second sub-word line segment SWL-2 extends parallel with the word strap line WSL and is electrically connected with the far end of the word strap line WSL by a contact metallization CM, to thereby be electrically connected with the output node ON of the associated sub-word driver 20.

Figure 1:
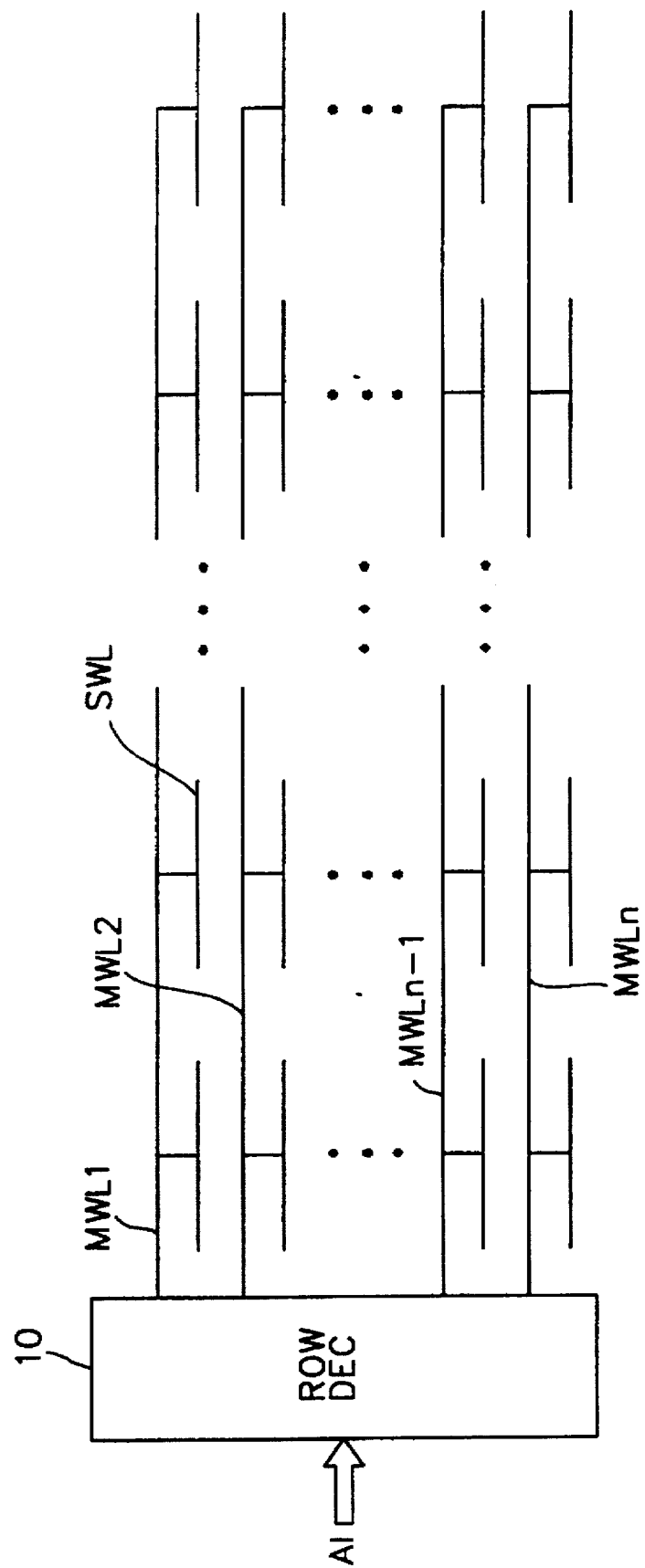
FIG. 1 is a diagram showing a conventional wiring arrangement of word lines and sub-word lines in a semiconductor memory device constructed using a word strap technique.
Figure 2:
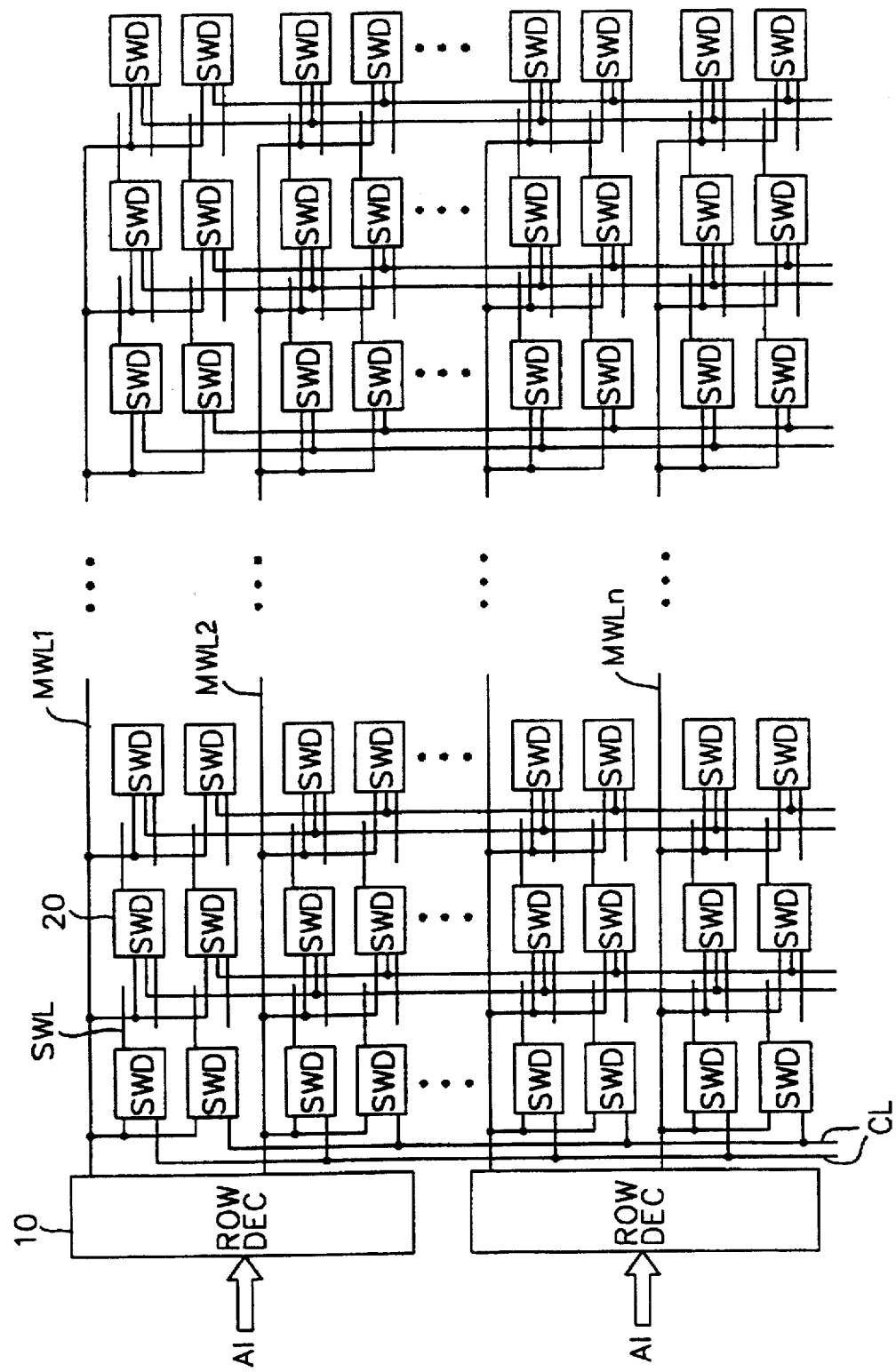
FIG. 2 is a diagram showing a conventional wiring arrangement of word lines in a semiconductor memory device adapting a hierarchical dual word line construction.

As will be understood by those skilled in the art, the sub-word line segments SWL-1 and SWL-2 are formed of a polysilicon or a polysilicide and form the gates of memory cell transistors of the memory device. Thus, the sub-word lines segments SWL-1 and SWL-2 together comprise a sub-word line SWL. That is, in accordance with the present invention, each sub-word line SWL in the conventional word line arrangement as shown in FIG. 2 is comprised instead of a first segment SWL-1 and of a second segment SWL-2 employing a word strap line WSL as shown in FIG. 3.

Further, as may be seen from FIG. 3, the word strap lines and sub-word line segments associated with a sub-word driver 20 arranged in a first or leftward column extend rightwardly toward the corresponding sub-word driver 20 arranged in the second or rightward column, while the word strap line WSL and sub-word line segments SWL-1, SWL-2 associated with the corresponding sub-word driver 20 of the second or rightward column extend leftwardly toward the corresponding sub-word driver 20 of the first or leftward column, such that the word strap line WSL and sub-word line segments SWL-1, SWL-2 associated with the sub-word driver 20 of the first or leftward column are arranged to extend parallel with and adjacently to the word stap line WSL and sub-word line segments SWL-1, SWL-2 associated with the corresponding sub-word driver 20 of the second or rightward column, with such an arrangement being repeated continuously between each two columns of sub-word drivers 20 in each sub-row throughout the memory array block 100-1. Therefore, it is possible to maintain a predetermined distance between the neighboring word-strap lines WSL which are parallely arranged in the row direction. That is, more than double the spacing between the word strap lines can be obtained compared with the conventional arrangement.

The segmentation points SP between the sub-word line segments SWL-1, SWL-2 of the sub-word lines SWL as well as the contact metallizations CM between the word strap lines WSL and second sub-word line segments SWL-2 are preferably located intermediately between the neighboring leftward and rightward columns of sub-word line drivers 20; however, the segmentation points SP between the sub-word line segments SWL-1, SWL-2 of one column are arranged in a zig-zag relation to those of the neigboring column, as are the associated contact metallizations CM, so that when the word strap lines WSL and second sub-word line segments SWL-2 are brought into electrical contact with each other in a word strap fabrication step, the contact metallizations CM do not interfere with each other.

A plurality of bit line pairs BL/BL connected to a corresponding plurality of sense amplifiers (SA) 30 in a manner well known in the art are arranged in the column direction between each column of sub-word drivers 20 to intersect with the sub-word lines segments SWL-1 and SWL-2. A plurality of memory cells MC each comprised of a capacitor and a transistor (not shown) are disposed at corresponding ones of the intersections of the bit line pairs and sub-word line segments SWL-1, SWL-2. The number of memory cells which are driven by each sub-word line driver 20 becomes double that of the conventional hierarchical word line structure, so that it is possible to reduce by half the number of sub-word line drivers 20 required.

A sub-word drive decoder (SDD) 40 is associated with each column of sub-word drivers 20. A pair of coding lines CL extend in the column direction from each sub-word driver decoder 40, and the power nodes PN of alternating ones of the sub-word drivers 20 in each column are connected to one or the other of the pair of coding lines, in conventional manner. It should be understood that a block decoder (not shown) and a plurality of word drive decoders (not shown) as disclosed in the above-mentioned prior U.S. patent publication could be provided in association with or in substitution for the sub-word drive decoders 40, but such elements are not described further herein because they are not essential to implementing the word line structure in accordance with the present invention, it being sufficient only to describe that the respective coding lines CL of each column are arranged to the power nodes PN of the respective sub-word drivers 20 of each column in conventional manner.

Figure 4A:
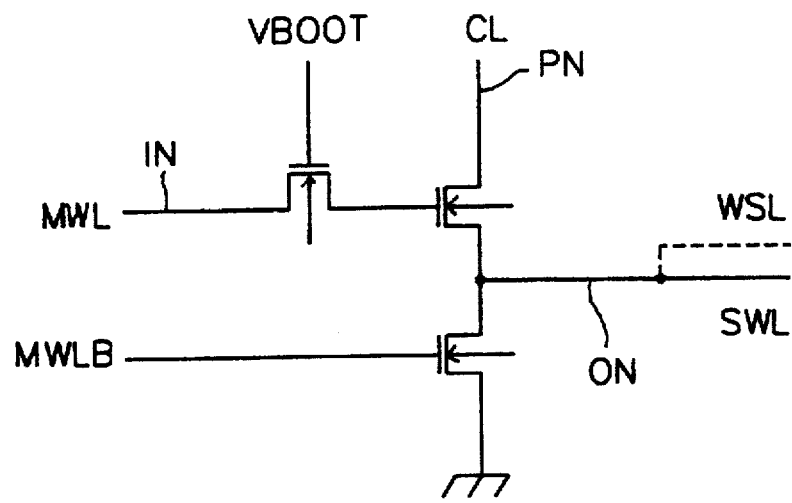
Figure 4B:
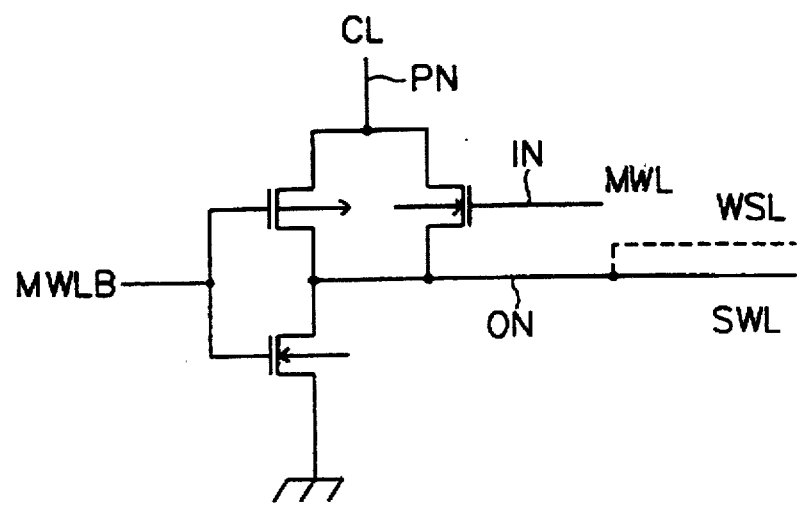

Referring to FIGS. 4A and 4B, the sub-word line driver 20 includes NMOS and/or PMOS transistors. A main-word line MWL connected to the input node IN, a sub-word line SWL (or first sub-word line segment) and a word strap line WSL connected to an output node ON, and a power node PN connected to the coding line CL are also shown therein. The above-described construction of the sub-word line driver 20 is conventional, except that in the present invention, the sub-word line SWL or a first segment SWL-1 therof and the word strap line WSL are commonly connected to the output node ON of the sub-word driver 20.

The operation of the semiconductor memory device impelementing the word line structure according to the first embodiment of the present invention will now be explained with reference to FIG. 3.

To begin with, the row decoder 10 at each of the memory array blocks 100-1 through 100-j selectively drives one of the main-word lines MWL in response to a first address information signal AI1 applied to the row decoder 10, and each sub-word driver decoder SDD 40 drives one of the coding lines CL to an active high level in response to decoding of a second address information signal AI2 applied thereto.

That is, the row decoder 10 drives one of the main-word lines MWL in accordance with decoding of the first address information signal AI1 applied thereto, and the coding signal of a coding line CL selected by decoding of the second address information signal AI2 by the sub-word drive decoder 40 drives the corresponding sub-word line driver 20 located in the column where the coding line CL contacts with the enabled main word line MWL.

Therefore, the sub-word line SWL and the word strap line WSL commonly connected to the output node ON of the selectively driven sub-word line driver 20 become high active state. At this time, the sub-word line segment SWL-1 directly connected to the sub-word line driver 20 assumes a high active level, and the sub-word line segment SWL-2 assumes a high active level through the word strap line WSL. The data of the associated memory cell is read when the sub-word line SWL which becomes high active level, or an externally applied data is written into the memory cell. Here, since the word strap line WSL is made of a material having a relatively low electrical resistance compared to the sub-word line SWL, the data access time of the memory cell positioned at the segmented sub-word line SWL-2 becomes short.

Figure 5:
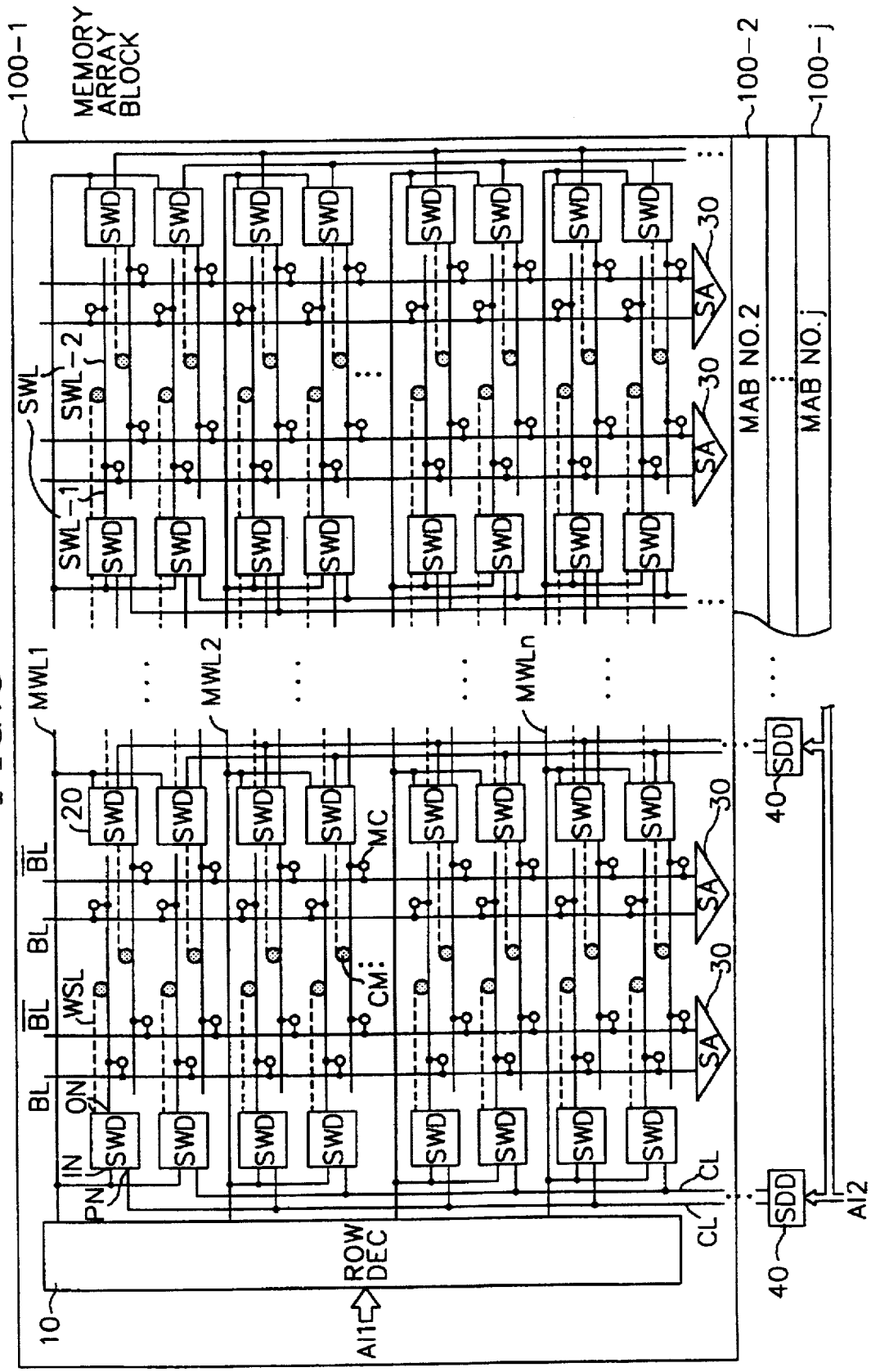
FIG. 5 is a block diagram of a word line structure of a semiconductor memory device according to a second embodiment of the present invention.

FIG. 5 shows a word line structure of a memory device according to a second embodiment of the present invention. As shown in FIG. 5, instead of the first and second sub-word line segments SWL-1, SWL-2 in the embodiment of FIG. 3, only one continuous unsegmented sub-word line SWL is provided, and the word strap line WSL is connected by a contact metallization CM to an intermediate point of the single sub-word line SWL.

Figure 6:
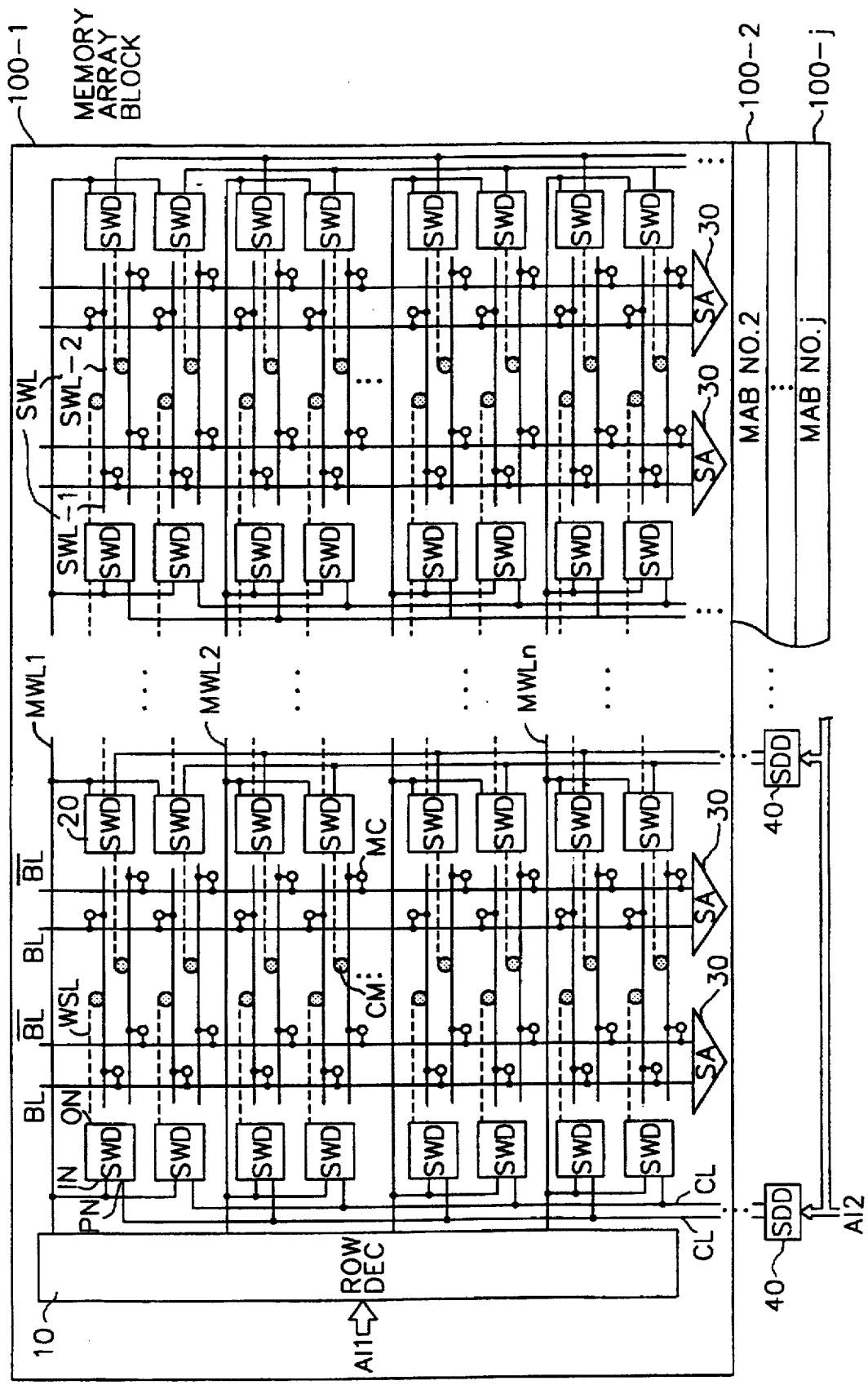
FIG. 6 is a block diagram of a word line structure of a semiconductor memory device according to a third embodiment of the present invention.

FIG. 6 shows a word line structure of a semiconductor memory device according to a third embodiment of the present invention. As shown therein, in this embodiment, the sub-word line SWL is driven only by the word-strap line WSL of which one end is connected to the output node ON of the sub-word line driver 20 and the other end is connected by a contact metallization CM to the intermediate point of the sub-word line SWL, without connecting the sub-word line SWL to the output node ON of the sub-word line driver 20. That is, the above-described construction according to the third embodiment of FIG. 6 has an advantage in that the number of contact points required for connecting the output nodes ON of the sub-word line drivers 20 with the sub-word lines SWL can be reduced by half.

Figure 7:
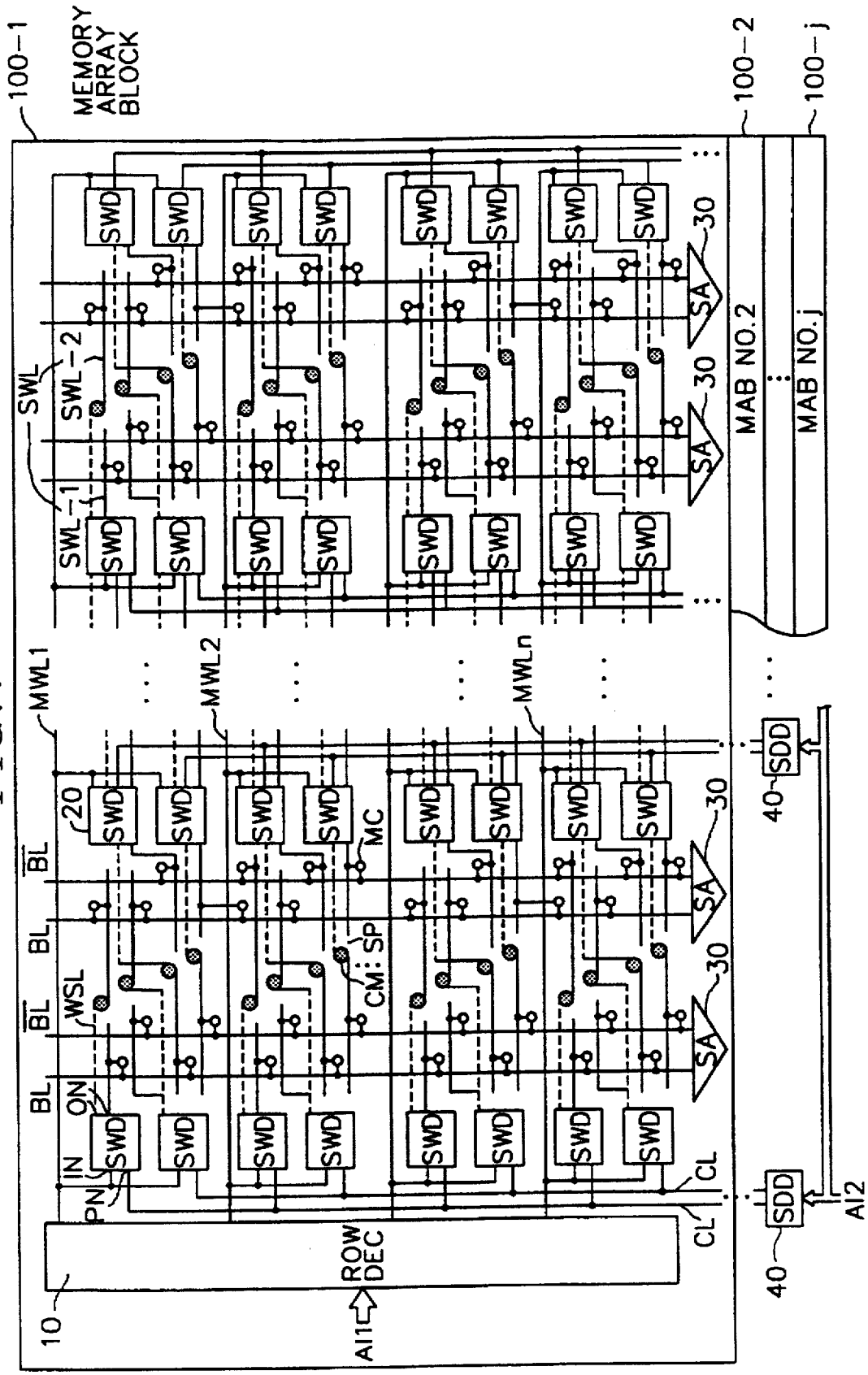
FIG. 7 is a block diagram of a word line structure of a semiconductor memory device according to a fourth embodiment of the present invention.

FIG. 7 shows a word line structure of a semiconductor memory device according to a fourth embodiment of the present invention. As shown therein, in respectively alternating ones of the sub-rows and in respectively alternating ones of the leftward and rightward columns (i.e., leftward column of first sub-row and rightward column of second sub-row) the word strap lines WSL and the first sub-word line segments SWL-1 of the sub-word lines SWL are connected to the output nodes ON of the corresponding sub-word line driver 20, with the word strap lines WSL being connected to the associated second sub-word line segments SWL-2 by contact metallizations, in similar manner as described above with reference to FIG. 3, that is, the associated word strap lines WSL and sub-word lines SWL (that is, SWL-1 and SWL-2) always extend parallel with one another. However, in the embodiment of FIG. 7, differently from the embodiment of FIG. 3, the word strap lines WSL and first sub-word line segments SWL-1 which are connected to the output node ON of their associated sub-word driver 20 in the corresponding other sub-rows and columns extend not only in the row direction toward the other column but also have portions thereof extended perpendicularly, that is, in the column direction, so as to laterally offset and extend along the adjacent sub-row.

In more detail, the first sub-word line segment SWL-1 connected to the output node ON of the sub-word driver 20 in the rightward column of the first sub-row extends only a short distance in the row direction and then extends laterally offset, that is, in the column direction, into the adjacent second sub-row, from which point it again extends in the row direction toward the first or leftward column until terminating at the segmentation point SP thereof. The associated second sub-word line segment SWL-2 extends in the row direction from the segmentation point SP of the first sub-word line segment SWL-1 and in alignment therewith in the second sub-row towards the leftward column. The corresponding word strap line WSL extends from the output node ON of the sub-word driver 20 in the row direction to a point beyond the segmentation point SP of the first sub-word line segment SWL-1 and then extends in the column direction towards the second sub-word line segment SWL-2 to which it is connected by a contact metallization CM.

Similarly, from the sub-word driver 20 in the first or leftward column and second sub-row, the first sub-word line segment SWL-1 extends from the output node ON in the row direction only short distance towards the adjoining second or rightward column before extending laterally offset in the column direction to the first sub-row, at which point it again extends in the row direction to its segmentation point SP, with its associated second sub-word line segment SWL-2 extending from the segmentation point along the first sub-row, and with the corresponding word strap line WSL being extended from the output node ON commonly with the first sub-word line segment SWL-1 and in the row direction along the second sub-row to a point beyond the segmentation point SP, from which point the word strap line WSL extends in the column direction to the second sub-word line segment SWL-2 to which it is connected by a contact metallization CM.

Figure 8:
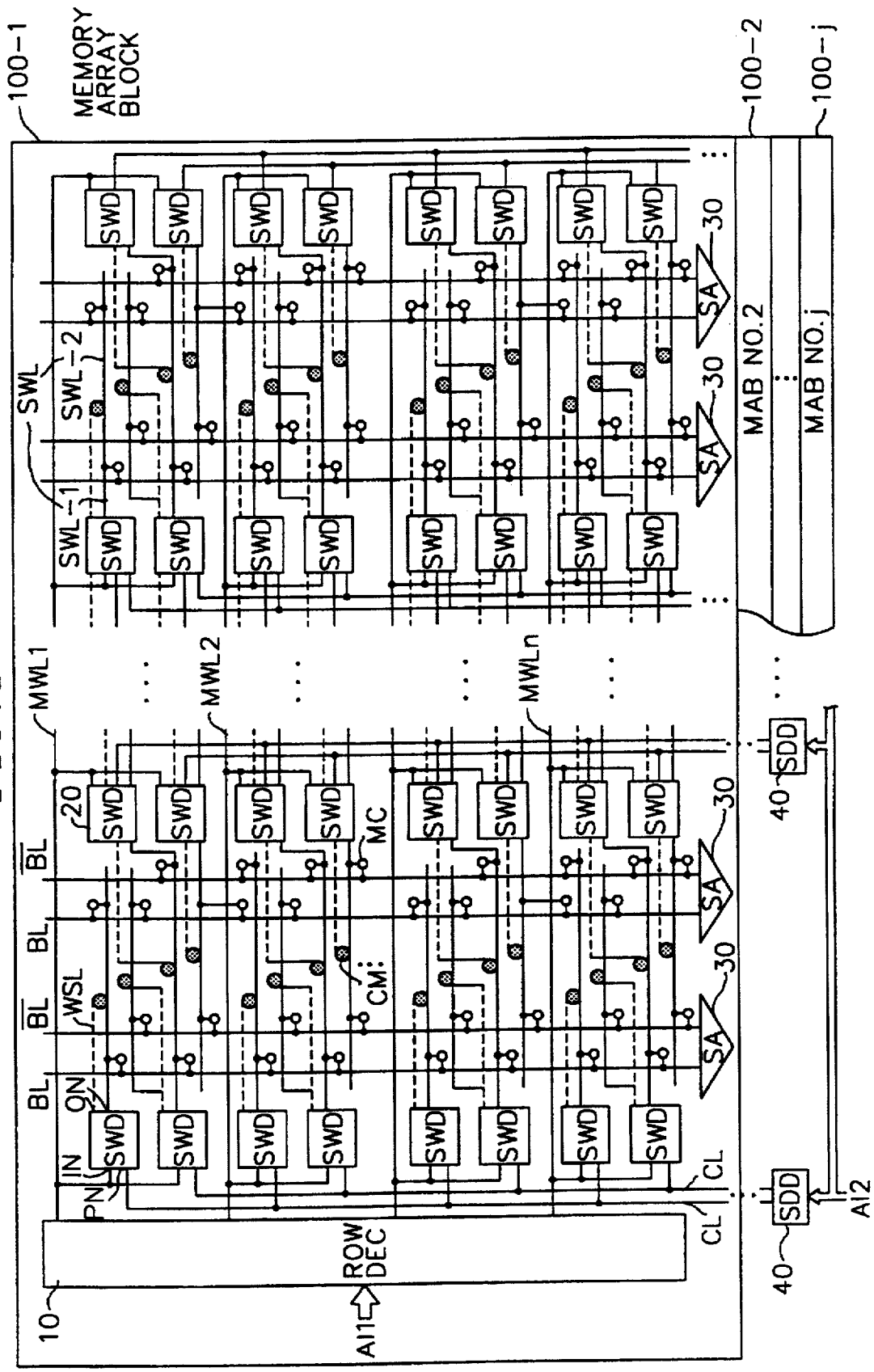
FIG. 8 is a block diagram of a word line structure of a semiconductor memory device according to a fifth embodiment of the present invention.

FIG. 8 shows a word line wiring construction of a semiconductor memory device according to a fifth embodiment of the present invention. Instead of the segmented sub-word lines SWL-1 and SWL-2 as shown in FIG. 7, only a single sub-word line SWL is provided in the arrangement of FIG. 8, and the word strap line WSL is connected by a contact metallization CM to the intermediate point of the sub-word line SWL.

Figure 9:
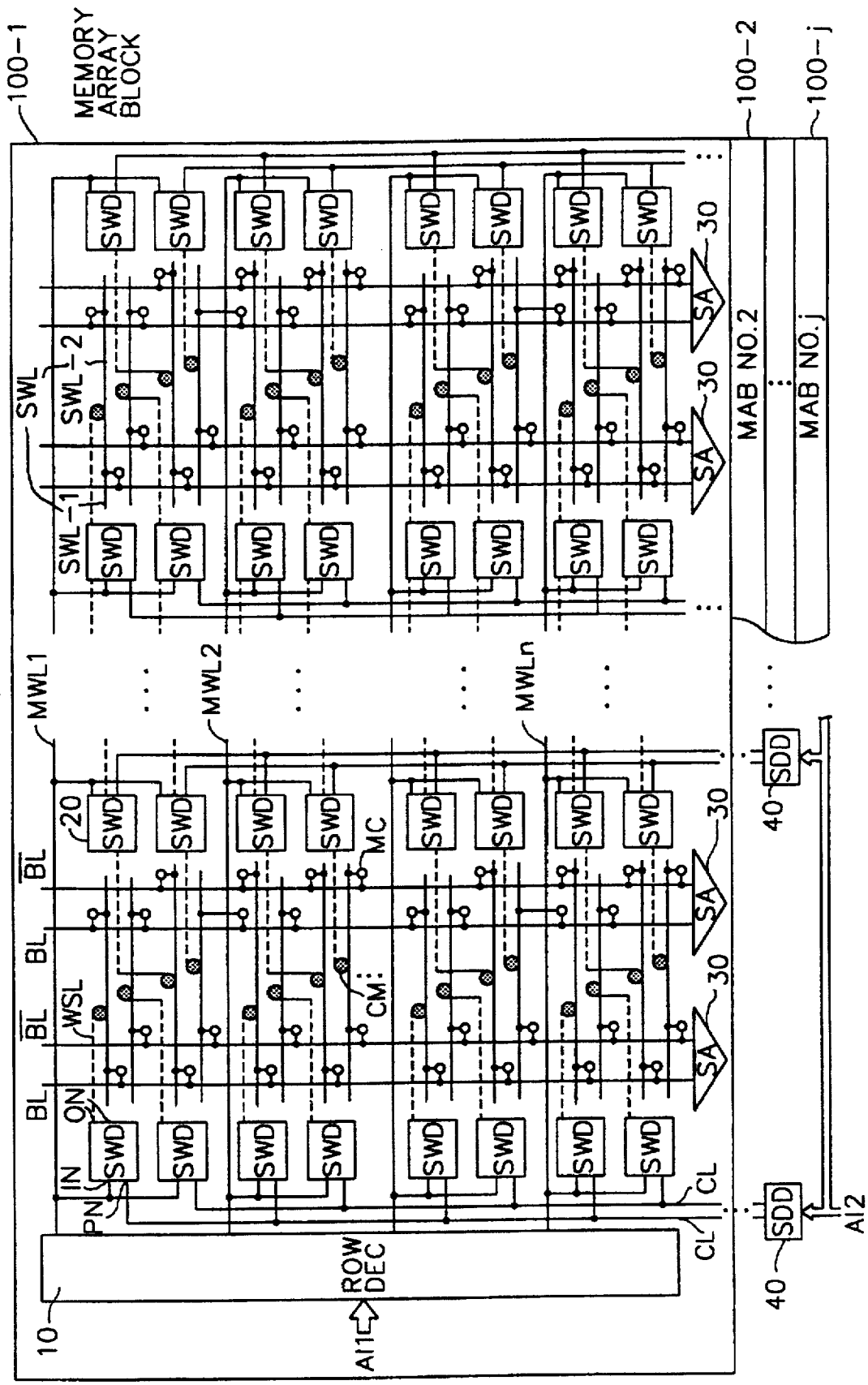
FIG. 9 is a block diagram of a word line structure of a semiconductor memory device according to a sixth embodiment of the present invention.

FIG. 9 shows a word line wiring arrangement for a semiconductor memory device according to a sixth embodiment of the present invention. This embodiment is directed to driving an unsegmented sub-word line SWL by only a word strap line WSL connected between the output node ON of the sub-word line driver 20 and an intermediate point of the unsegmented sub-word line SWL without connecting the sub-word line SWL to the output node of the sub-word line driver 20. That is, this embodiment has the advantages in that as in the third embodiment of FIG. 6, the number of contacts required between the sub-word line driver 20 and the sub-word line SWL can be reduced. Also, because it is not necessary to connect the unsegmented sub-word lines SWL of the alternating columns and sub-rows with the sub-word drivers 20, the subword lines need not be extended in the column direction as in the embodiments of FIGS. 7 and 8, but may be extended only in the row direction, and only the corresponding word strap lines need have portions which are laterally offset.

As described above, the semiconductor memory device of the present invention has advantages in that a desired pitch spacing between the metallic lines used as the main-word lines is achieved and it is possible to obtain a pitch spacing between the metallic lines used as the main-word lines and a pitch spacing between the sub-word lines which is double that of conventional arrangements. Therefore, the semiconductor device fabrication process becomes simpler, and the yield thereof is improved, and the word line arrangement of present invention is especially useful in case the number of metallic layers used in the DRAM semiconductor memory device of more than 256-Mb is more than three.

In addition, since the number of sub-word drivers occupying the lay-out area can be reduced by using a word strap line between two sub-word line drivers when constructing a hierarchical word line, the size of the semiconductor memory chip can be minimized. For example, the lay-out area of the word strap line is about ⅓ the lay-out area of the NMOS sub-word line driver, and is about ⅛ the lay-out area of the CMOS sub-word line driver.

Therefore, when using the word line arrangement of the present invention with NMOS sub-word line drivers, the lay-out area can be reduced by 40% compared to the conventional hierarchical word line structure in which an NMOS sub-word line driver is used. In addition, when using the word line arrangement of the present invention with CMOS sub-word line drivers, the lay-out area is reduced about 43.8%. Moreover, when using the word line arrangement of the present invention while maintaining the size of the chip, since it is possible to obtain more than 10% of the fabrication process margin in the word line direction based on a 256-Mb DRAM during a memory cell fabrication process, the semiconductor cell process becomes simpler, and the yield of the same can be improved significantly.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A memory device comprising:

a plurality of bitlines and main wordlines formed in first and second directions, respectively, to form a matrix, and a plurality of memory cells coupled to each bitline;

a first decoder for decoding first address signals and providing first decoded signals to said plurality of main wordlines;

a second decoder for decoding second address signals and providing second decoded signals;

n-th number of groups of drivers, each group having a plurality of sub-drivers formed in a third direction and receiving a corresponding second decoded signal, each sub-driver having a plurality of selection lines coupled to corresponding memory cells; and a plurality of sense amplifiers coupled to said plurality of bitlines, wherein more than two bitlines are formed between adjacent groups of drivers.

2. The memory device of claim 1, wherein each sub-driver of 1st and n-th groups have selection lines coupled to two memory cells.

3. The memory device of claim 1, wherein each sub-driver of 2nd to (n−1)th groups have selection lines coupled to more than two memory cells.

4. The memory device of claim 1, wherein the first and third directions are column directions, and the second direction is a row direction.

5. The memory device of claim 1, wherein four bitlines are formed between adjacent groups of drivers.

6. The memory device of claim 1, wherein said four bitlines comprise two bitline pairs.

7. The memory device of claim 2, wherein said selection lines of each sub-driver of 1st and n-th groups comprise a word strapline and first and second sub-word lines, said word strapline and first sub-word lines are coupled to said sub-driver and parallel to each other and said second sub-word line is coupled to said word strapline by a contact metallization, and said first and second sub-word lines are aligned with each other and each of said first and second sub-word lines being coupled to a memory cell.

8. The memory device of claim 3, wherein said selection lines of each sub-driver of 2nd to (n−1)th groups comprises a first word strapline and first and second sub-word lines formed at a first side of the sub-word driver, said first word strapline and first sub-word lines are coupled to said sub-driver and parallel to each other and said second sub-word line is coupled to said first word strapline by a first contact metallization, and said first and second sub-word lines are aligned with each other and each of said first and second sub-word lines being coupled to a memory cell; and a second word strapline and third and fourth sub-word lines formed at a second side of the sub-word driver, said second word strapline and third sub-word lines are coupled to said sub-driver and parallel to each other and said fourth sub-word line is coupled to second word strapline by a second contact metallization, and said third and fourth sub-word lines are aligned with each other and each of said third and fourth sub-word lines being coupled to a memory cell.

9. The memory device of claim 2, wherein selection lines of each odd sub-driver of said plurality of sub-drivers in 1st and n-th groups comprise a first word strapline and first and second sub-word lines, said first word strapline and first sub-word lines are coupled to said sub-driver and parallel to each other and said second sub-word line is coupled to said first word strapline by a first contact metallization, and said first and second sub-word lines are aligned with each other and each of said first and second sub-word lines being coupled to a memory cell; and selection lines of each even sub-driver of said plurality of sub-drivers in 1st and n-th groups comprise a second word strapline and third and fourth sub-word lines, said third sub-word line is coupled said second word strapline and is laterally offset toward an adjacent odd sub-driver and said fourth sub-word line is coupled to said second word strapline by a second contact metallization, and said third and fourth sub-word lines are aligned with each other and each of said third and fourth sub-word lines being coupled to a memory cell.

10. The memory cell of claim 3, wherein selection lines of each even sub-driver of said plurality of sub-drivers in 2nd and (n−1)th groups comprise:

a first word strapline and first and second sub-word lines formed at a first side of said even sub-word driver, said first word strapline and first sub-word lines are coupled to said even sub-driver and parallel to each other and said second sub-word line is coupled to said first word strapline by a first contact metallization, and said first and second sub-word lines are aligned with each other and each of said first and second sub-word lines being coupled to a memory cell; and a second word strapline and third and fourth sub-word lines formed at a second side of the even sub-word driver, said second word strapline and third sub-word lines are coupled to said even sub-driver and parallel to each other and said fourth sub-word line is coupled to said second word strapline by a second contact metallization, and said third and fourth sub-word lines are aligned with each other and each of said third and fourth sub-word lines being coupled to a memory cell.

11. The memory device of claim 10, wherein said selection lines of each odd sub-driver of said plurality of sub-drivers in 2nd and (n−1)th groups comprise a first word strapline and first and second sub-word lines formed at a first side of said odd sub-word driver, and a second word strapline and third and fourth sub-word lines formed at a second side of said odd sub-word driver, said third sub-word line and said second word strapline are coupled to said odd sub-driver and are laterally offset towards an adjacent even sub-driver and said fourth sub-word line is coupled to said second word strapline by a contact metallization, and said third and fourth sub-word lines are aligned with each other and each of said third and fourth sub-word lines being coupled to a memory cell, and said first word strap line and first and second sub-word lines of said odd sub-driver having the same configuration as said second word strapline and third and fourth sub-word lines.

12. The memory device of claim 2, wherein said selection lines of each sub-driver of 1st and n-th groups comprise a word strapline and first and second sub-word lines, said word strapline and first sub-word lines are coupled to said sub-driver and parallel to each other, and said first and second sub-word lines are coupled to said word strapline by a contact metallization, said first and second sub-word lines being aligned with each other and each of said first and second sub-word lines being coupled to a memory cell.

13. The memory device of claim 3, wherein said selection lines of each sub-driver of 2nd to (n−1)th groups comprises:

a first word strapline and first and second sub-word lines formed at a first side of the sub-word driver, said first word strapline and first sub-word lines are coupled to said sub-driver and are parallel to each other, and said first and second sub-word lines are coupled to said first word strapline by a first contact metallization, said first and second sub-word lines being aligned with each other and each of said first and second sub-word lines being coupled to a memory cell; and a second word strapline and third and fourth sub-word lines formed at a second side of the sub-word driver, said second word strapline and third sub-word lines are coupled to said sub-driver and are parallel to each other and said third and fourth sub-word lines are coupled to said second word strapline by a second contact metallization, each of said third and fourth sub-word lines being coupled to a memory cell.

14. The memory device of claim 3, wherein selection lines of each odd sub-driver of said plurality of sub-drivers in 1st and n-th groups comprise a first word strapline and first and second sub-word lines, said first word strapline and first sub-word lines are coupled to said sub-driver and are parallel to each other, and said first and second sub-word line are coupled to said first word strapline by a first contact metallization, said first and second sub-word lines being aligned with each other and each of said first and second sub-word lines being coupled to a memory cell; and selection lines of each even sub-driver of said plurality of sub-drivers in 1st and n-th groups comprise a second word strapline and third and fourth sub-word lines, said third sub-word line is coupled to said second word strapline and is laterally offset towards an adjacent odd sub-driver, and said third and fourth sub-word line are coupled to said second word strapline by a second contact metallization, and said third and fourth sub-word lines being aligned with each other and each of said third and fourth sub-word lines being coupled to a memory cell.

15. The memory cell of claim 3, wherein selection lines of each even sub-driver of said plurality of sub-drivers in 2nd and (n−1)th groups comprise:

a first word strapline and first and second sub-word lines formed at a first side of said even sub-word driver, said first word strapline and first sub-word lines are coupled to said even sub-driver and are parallel to each other, and said first and second sub-word line is coupled to said first word strapline by a first contact metallization, said first and second sub-word lines being aligned with each other, and each of said first and second sub-word lines being coupled to a memory cell; and a second word strapline and third and fourth sub-word lines formed at a second side of the even sub-word driver, said second word strapline and third sub-word lines are coupled to said even sub-driver and are parallel to each other and said fourth sub-word line is coupled to said second word strapline by a second contact metallization, said third and fourth sub-word lines being aligned with each other and each of said third and fourth sub-word lines being coupled to a memory cell.

16. The memory device of claim 14, wherein said selection lines of each odd sub-driver of said plurality of sub-drivers in 2nd and (n−1)th groups comprise a first word strapline and first and second sub-word lines formed at a first side of said odd sub-word driver, and a second word strapline and third and fourth sub-word lines formed at a second side of said odd sub-word driver, said third sub-word line and said second word strapline are coupled to said odd sub-driver and are laterally offset toward an adjacent even sub-driver and said third and fourth sub-word lines are coupled to said second word strapline by a second contact metallization, said third and fourth sub-word lines being aligned with each other and each of said third and fourth sub-word lines being coupled to a memory cell, and said first word strap line and first and second sub-word lines of said odd sub-driver having the same configuration as said second word strapline and third and fourth sub-word lines.

17. The memory device of claim 2, wherein said selection lines of each sub-driver of 1st and n-th groups comprise a word strapline and first and second sub-word lines, said word strapline is coupled to said sub-driver, and said first and second sub-word lines are coupled to said word strapline by a contact metallization, said first and second sub-word lines being aligned with each other and each of said first and second sub-word lines being coupled to a memory cell.

18. The memory device of claim 3, wherein said selection lines of each sub-driver of 2nd to (n−1)th groups comprises:

a first word strapline and first and second sub-word lines formed at a first side of the sub-word driver, said first word strapline is coupled to said sub-driver, and said first and second sub-word lines are coupled to said first word strapline by a first contact metallization, each of said first and second sub-word lines being coupled to a memory cell; and a second word strapline and third and fourth sub-word lines formed at a second side of the sub-word driver, said second word strapline is coupled to said sub-driver and said third and fourth sub-word line are coupled to said second word strapline by a second contact metallization, each of said third and fourth sub-word lines being coupled to a memory cell.

19. The memory device of claim 2, wherein selection lines of each odd sub-driver of said plurality of sub-drivers in 1st and n-th groups comprise a first word strapline and first and second sub-word lines, said first word strapline line is coupled to said sub-driver and said first and second sub-word line are coupled to said first word strapline by a first contact metallization, each of said first and second sub-word lines being coupled to a memory cell; and selection lines of each even sub-driver of said plurality of sub-drivers in 1st and n-th groups comprise a second word strapline and third and fourth sub-word lines, said third and fourth sub-word line sub-word lines are coupled to said second word strapline by a second contact metallization and are laterally offset toward an adjacent odd sub-driver, each of said third and fourth sub-word lines being coupled to a memory cell.

20. The memory cell of claim 3, wherein selection lines of each even sub-driver of said plurality of sub-drivers in 2nd and (n−1)th groups comprise:

a first word strapline and first and second sub-word lines formed at a first side of said even sub-word driver, said first word strapline is coupled to said even sub-driver, and said first and second sub-word lines are coupled to said first word strapline by a first contact metallization, said first and second sub-word lines being aligned with each other, and each of said first and second sub-word lines being coupled to a memory cell; and a second word strapline and third and fourth sub-word lines formed at a second side of the even sub-word driver, said second word strapline is coupled to said even sub-driver, and said fourth sub-word line is coupled to said second word strapline by a second contact metallization, said third and fourth sub-word lines being aligned with each other, and each of said third and fourth sub-word lines being coupled to a memory cell.

21. The memory device of claim 19, wherein said selection lines of each odd sub-driver of said plurality of sub-drivers in 2nd and (n−1)th groups comprise:

a first word strapline and first and second sub-word lines formed at a first side of said odd sub-word driver, and a second word strapline and third and fourth sub-word lines formed at a second side of said odd sub-word driver, said third sub-word line is coupled to said odd sub-driver, and said third and fourth sub-word lines are laterally offset toward an adjacent even sub-driver, and are coupled to said second word strapline by a second contact metallization, each of said third and fourth sub-word lines being coupled to a memory cell, and said first word strap line and first and second sub-word lines of said odd sub-driver having the same configuration as said second word strapline and third and fourth sub-word lines.

* * * * *